United States Patent
Ikeda

(10) Patent No.: US 6,803,116 B2
(45) Date of Patent: Oct. 12, 2004

(54) METHOD OF BONDING A CONDUCTIVE ADHESIVE AND AN ELECTRODE, AND A BONDED ELECTRODE OBTAINED THEREBY

(75) Inventor: Haruhiko Ikeda, Omihachiman (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 239 days.

(21) Appl. No.: 09/927,053

(22) Filed: Aug. 9, 2001

(65) Prior Publication Data
US 2002/0050320 A1 May 2, 2002

(30) Foreign Application Priority Data
Aug. 9, 2000 (JP) ........................................ 2000-240709

(51) Int. Cl.$^7$ ................. C09J 5/06; C09J 9/02
(52) U.S. Cl. .............. 428/546; 428/643; 257/778; 257/783
(58) Field of Search .................. 257/782, 783, 257/778, 779, 781; 428/544, 546, 643

(56) References Cited

U.S. PATENT DOCUMENTS

| | | |
|---|---|---|
| 4,814,040 A | 3/1989 | Ozawa |
| 5,136,365 A | 8/1992 | Pennisi et al. |
| 5,376,403 A | 12/1994 | Capote et al. |
| 5,463,190 A | 10/1995 | Carson et al. |
| 5,542,602 A | 8/1996 | Gaynes et al. |
| 5,679,928 A * | 10/1997 | Okano et al. ............... 174/261 |
| 5,713,508 A | 2/1998 | Gaynes et al. |
| 5,837,119 A | 11/1998 | Kang et al. |
| 5,853,622 A | 12/1998 | Gallagher et al. |
| 6,184,577 B1 * | 2/2001 | Takemura et al. .......... 257/701 |
| 6,448,624 B1 * | 9/2002 | Ishio et al. ................. 257/417 |
| 2002/0008321 A1 * | 1/2002 | Itagaki et al. ............... 257/738 |

FOREIGN PATENT DOCUMENTS

| | | |
|---|---|---|
| DE | 40 36 274 A1 | 6/1991 |
| EP | 0265077 | 4/1988 |
| EP | 0428165 | 5/1991 |
| EP | 0708582 | 4/1996 |
| JP | 07-179832 | 7/1995 |

OTHER PUBLICATIONS

Copy of German Examination Report dated Nov. 19, 2003 (and English translation of same).

* cited by examiner

Primary Examiner—Jeff H. Aftergut
Assistant Examiner—John T. Haran
(74) Attorney, Agent, or Firm—Dickstein, Shapiro, Morin & Oshinsky, LLP.

(57) ABSTRACT

The present invention relates to a method of bonding a conductive adhesive and an electrode together, which is capable of obtaining electrical bonding between a conductive electrode and an electrode. In this method, a conductive adhesive containing a conductive filler and an organic binder is coated on an electrode having a layer formed thereon by plating a low-melting-point material, and then heated to cure the organic binder and melt the plated layer on the electrode. As a result, the conductive filler contained in the adhesive enters the plated layer to obtain strong bonding between the plated layer and the conductive filler.

7 Claims, 2 Drawing Sheets

Fig.2

| Electrode | Sn−48In | Sn−58Bi | Sn−37Pb | Sn |
|---|---|---|---|---|
| Melting Point | 117°C | 139°C | 183°C | 232°C |
| Temperature | 110°C | 130°C | 150°C | 150°C |
| Sectional Photograph | | | | |
| Electric Resistance | Un-measurable | 0.0251 Ω | 0.0034 Ω | 0.0027 Ω |
| Temperature | 150°C | 150°C | 200°C | 250°C |
| Sectional Photograph | | | | |
| Electric Resistance | 0.0047 Ω | 0.0044 Ω | 0.0020 Ω | 0.0035 Ω |

METHOD OF BONDING A CONDUCTIVE ADHESIVE AND AN ELECTRODE, AND A BONDED ELECTRODE OBTAINED THEREBY

BACKGROUND OF THE INVENTION

1. Field of the Invention

The present invention relates to a method of bonding a conductive adhesive and an electrode together, and the bonded structure obtained thereby. More, particularly, the present invention relates to a method of electrically and mechanically bonding a surface mount device to a land electrode using a conductive adhesive and the resulting bonded structure.

2. Description of the Related Art

Surface mount devices are sometimes bonded to a land electrode on a mother substrate using a conductive adhesive in place of solder. The conductive adhesive comprises an organic binder (e.g., a thermosetting epoxy resin) and a conductive filler (e.g., Ag particles).

In order to mount the surface mount device on the land electrode, the surface mount device is adhered to the land electrode with the conductive adhesive provided therebetween, and then both components are pressure-bonded together and heated to cure the conductive adhesive so as to electrically and mechanically bond the surface mount device to the land electrode. As a result of this process, the conductive filler particles contained in the conductive adhesive are connected to one another in a form of chain to produce a conductive path, thereby obtaining conductivity between the land electrode and the surface mount device.

While the foregoing process results in a secure bond between the surface mount device and the land electrode, the conductive adhesive absorbs moisture which will cause a defective bonding at the interface between the conductive adhesive and the land electrode when the bonded structure is allowed to stand in a high-humidity atmosphere in a pressure cooker test or the like, thereby causing an increase in the electric resistance of the bonded portion. For example, when the pressure cooker test is performed for 100 hours, the resistance value is at least ten thousands times as large as the initial resistance value.

Japanese Unexamined Patent Publication Application No. 7-179832 discloses a method of achieving bonding with high reliability using such a conductive adhesive. The method comprises forming low-melting-point metallic layers on the surfaces of the conductive filler particles, curing a binder resin contained in the conductive adhesive and, and at the same time, melting the low-melting-point metallic layers on the surfaces of the conductive filler particles to fusion-bond the conductive filler together. As a result, bonding with high reliability can be obtained due to fusion-bonding of the metal particles of the conductive filler.

This prior art structure has two major drawbacks. It is costly because of the need to utilize a special conductive filler wherein low-melting-point layers are formed on the surfaces of the metal particles. Additionally, it does not address the problem of connection reliability at the interface between the conductive adhesive and the land electrode.

SUMMARY OF THE INVENTION

Accordingly, a main object of the present invention is to provide a method of bonding a conductive adhesive and an electrode together which is capable of achieving good electrical bonding between the conductive adhesive and the electrode.

Another object of the present invention is to provide a bonded structure having high reliability and good electrical bonding.

In accordance with an aspect of the present invention, there is provided a method of bonding a conductive adhesive and an electrode together comprising:

coating a conductive adhesive containing a conductive filler and an organic binder on at least a surface of an electrode formed on a substrate; and melting at least the surface of the electrode to form a fusion-bond between the surface of the electrode and the conductive filler; and curing the organic binder contained in the conductive adhesive to electrically and mechanically bond the conductive adhesive and the electrode together.

In this method, the surface of the electrode is melted and fusion-bonded to the conductive filler, and thus the metal particles of the electrode surface and the conductive filler are fusion-bonded together with the conductive filler entering the surface of the electrode, thereby bonding the conductive adhesive and the electrode together with high reliability and good electrical properties.

In the method of bonding the conductive adhesive and the electrode of the present invention, a thermosetting resin is preferably used as the organic binder, and thus heating the conductive adhesive and the electrode under predetermined heating conditions causes the surface of the electrode to be melted and fusion-bonded to the conductive filler contained in the conductive adhesive and causes the organic binder to be thermally cured to bond the conductive adhesive and the electrode together.

The surface of the electrode preferably comprises a low-melting-point metal material which can be melted under the above heating conditions.

In order to obtain the surface of the electrode, a layer can be formed on the surface of the electrode by plating a low-melting-point metal material.

The conductive filler contained in the conductive adhesive preferably comprises scale-like conductive filler particles. The scale-like conductive filler particles easily enter the surface of the electrode, thereby enhancing the bonding strength between the conductive adhesive and the electrode.

When the surface of the electrode is melted, at least a portion of the conductive filler contained in the conductive adhesive is also melted. As a result, the conductive adhesive and the electrode are bonded together, and the respective conductive filler particles are fusion-bonded together to decrease the resistivity of the conductive adhesive, thereby obtaining excellent electrical properties.

In accordance with another aspect of the present invention, there is provided a method of bonding a pair of electrodes having a conductive adhesive, the method comprising:

coating the conductive adhesive containing a conductive filler and an organic binder on at least a first electrode formed on a surface of a first substrate;

adhering the conductive adhesive formed on the first electrode to a second electrode formed on a surface of a second substrate;

melting at least the surfaces of the first electrode and the second electrode to form a fusion-bond between the surfaces of the first and second electrodes and the conductive filler contained in the conductive adhesive;

and curing the organic binder contained in the conductive adhesive to electrically and mechanically bond the conductive adhesive and the first and second electrodes together.

In this method, the surfaces of the first and second electrodes are melted and fusion-bonded to the conductive filler, and thus the metal particles of the surface of each of the electrodes and the conductive filler are fusion-bonded together with the conductive filler entering the surfaces of the electrodes. As a result, the first and second electrodes are bonded together via the conductive adhesive with high reliability and good conductivity.

In accordance with a further aspect of the present invention, there is provided a bonded structure formed by any one of the above-described methods of bonding a conductive adhesive and an electrode. In this bonded structure, the conductive filler contained in the conductive adhesive and the electrode are fusion-bonded together with the conductive filler entering the surface of the electrode, thereby achieving good electrical bonding with high reliability.

The above-described objects and other objects, characteristics and advantages of the present invention will be made apparent from the detailed description of preferred embodiments below with reference to the drawings.

BRIEF DESCRIPTION OF THE DRAWINGS

Other features and advantages of the present invention will become apparent from the following description of the invention which refers to the accompanying drawings.

FIG. 2 is a drawing showing the relations between the bonded structure and the initial resistance value, etc. of each sample in Example 1.

DETAILED DESCRIPTION OF EMBODIMENTS OF THE INVENTION

Figure 1:
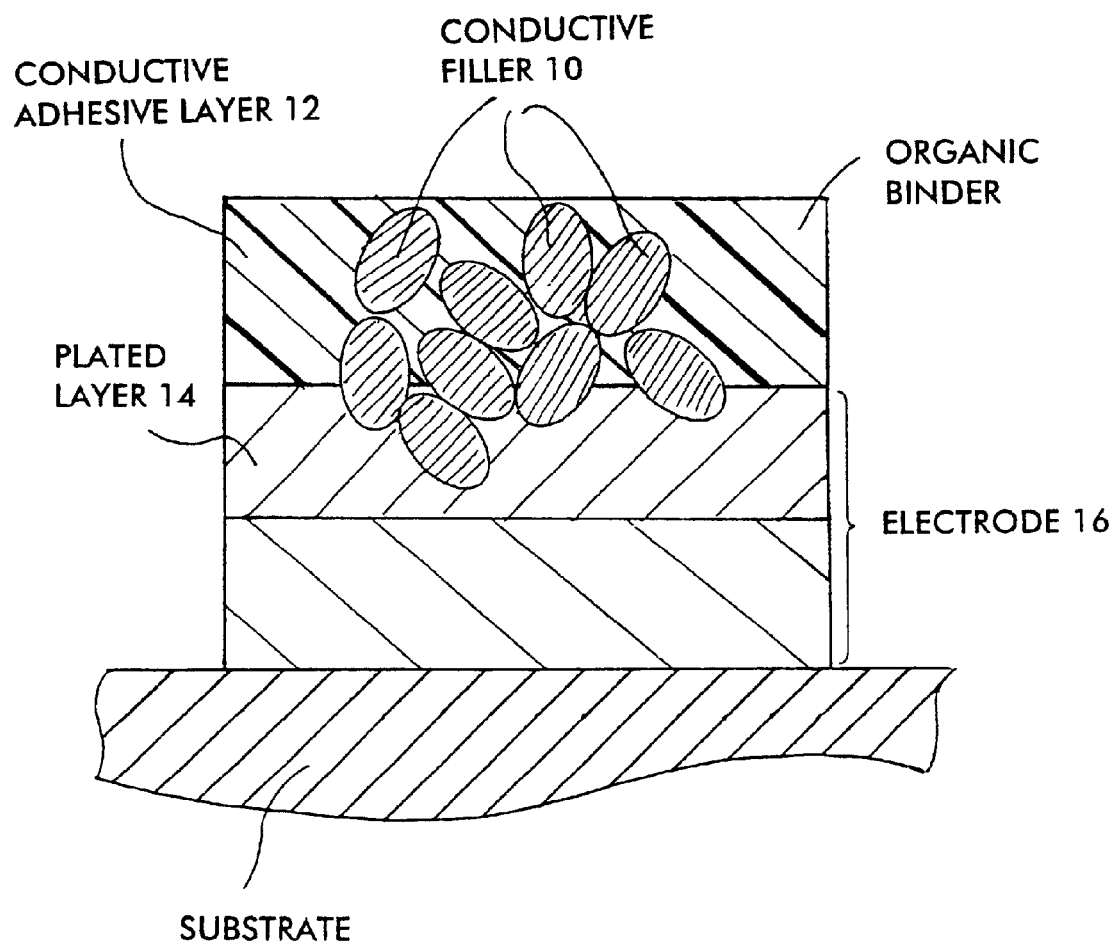
FIG. 1 is a drawing illustrating conductive bonding performed by a conductive bonding method of the present invention. Only one electrode is bonded to the conductive filler in this figure.

A conductive adhesive used in the present invention contains at least a conductive filler and an organic binder. By way of example, a thermosetting epoxy resin can be used as the organic binder and scale-like silver particles can be used as the conductive filler. The organic binder preferably has a curing temperature close to the melting point of the electrode surface (preferably a plated layer located on a base layer of the electrode) to which the conductor adhesive is adhered.

In order to mount a surface mount device on a first electrode formed on a surface of a substrate, such as a mother substrate or the like, the conductive adhesive is preferably first coated on the first electrode and then the surface mount device is adhered to the electrode. Particularly, a second electrode formed on a surface of the surface mount device and the substrate are adhered to each other with the conductive adhesive provided therebetween. More generally, first and second electrodes are coupled together using the conductive adhesive.

In the preferred embodiment, a plated layer made of a low-melting-point material, for example, Sn—Pb or the like, is preferably formed on the surface of a base layer each of the first and second electrodes. Then, the electrodes and the conductive adhesive are heated under predetermined heating conditions to melt the low-melting-point material of the surfaces of the first and second electrodes and to fusion-bond the low-melting-point material and the conductive filler together. At the same time, the thermosetting organic binder is cured to firmly fix the conductive adhesive and the electrodes to one another.

As a result, the conductive filler 10 (FIG. 1) contained in the conductive adhesive layer 12 enters the plated layer 14 defining the surface of each of the electrode 16 to electrically bond the conductive adhesive layer 12 and the electrode 16 together as shown in FIG. 1. Furthermore, the organic binder contained in the conductive adhesive layer is cured to mechanically bond the conductive adhesive layer and the electrode together.

In this way, the plated layers forming the surfaces of the electrodes are melted, and the conductive filler contained in the conductive adhesive enters the plated layers to strongly bond the conductive adhesive and the electrodes together. Also, the conductive filler enters the plated layers to increase the contact area between the plated layers and the conductive filler, thereby enhancing bonding strength due to an increase in the bonding area and decreasing conduction resistance.

Furthermore, since the contact area at the interface between each of the plated layers and the conductive filler is increased to increase the bonding strength, less moisture or the like enters the interfaces between the conductive adhesive and the electrodes, thereby significantly improving moisture resistance at the interfaces. Furthermore, since each of the electrodes preferably comprises an element assembly made of copper, silver or the like, and the plated layer defining the surface thereof is made of a low-melting-point material, bonding with high reliability can be obtained without using an expensive special conductive filler.

Indeed, the bonding between the conductive filler and the electrode in accordance with the present invention is better than that obtained in the prior art process wherein the conductive adhesive contains a conductive filler comprising Ag particles having surfaces coated with Sn layers of a low-melting-point metal. In that prior art process, the Sn layers on the surfaces of the conductive filler are melted at a usual heating temperature while the Ag electrode is not melted. As a result, a metal compound such as $Ag_3Sn$ or the like is formed on the surface of the Ag electrode to bond the Ag electrode and the conductive filler together. However, the bonding strength is low when bonding is performed only by formation of the foregoing metallic compound. In contrast, the conductive filler of the present invention enters the plated layer, and the low-melting-point metal of the plated layer and the conductive filler of the conductive adhesive layer are fusion-bonded together with the result that the mechanical strength of the conductive filler itself is added to bonding strength to obtain higher strength.

EXAMPLES

Example 1

The various types of plating shown in Table 1 were performed on a surface of a copper electrode formed on a substrate to prepare samples for testing. An epoxy conductive adhesive containing a scale-like Ag filler was coated on each of the samples. The content of the Ag filler in the conductive adhesive was 80% by mass, and the particle diameter of the Ag filler was 5 to 10 $\mu$m. As shown in Table 1, the adhesive was bonded to the plated surface of the electrode under two types of heating conditions, namely, a first temperature which melted the plated layer, and a second temperature which did not melt the plated layer. Then, the initial resistance values of the bonded portions were measured to obtain the results shown in Table 2. FIG. 2 shows a section of each of the bonded portions which shows either the presence or absence of fusion-bonding. In Table 2, the presence of the mark O in the evaluation column indicates that fusion-bonding between the epoxy conductive adhesive and the plated layer of the electrode surface was observed, and the presence of the mark X in the evaluation column indicates that fusion-bonding was not observed.

TABLE 1

| Sample No. | Plating forming Electrode surface | Melting point of Plating Material (° C.) | Heating Condition (° C.) | Heating Time (min) |
|---|---|---|---|---|
| 1 | Sn-48In | 117 | 110 | 5 |
| 2 | | | 150 | 5 |
| 3 | Sn-58Bi | 139 | 130 | 5 |
| 4 | | | 150 | 5 |
| 5 | Sn-37Pb | 183 | 150 | 5 |
| 6 | | | 200 | 5 |
| 7 | Sn | 232 | 150 | 5 |
| 8 | | | 250 | 5 |

Each of the samples was subjected to a humidity standing test to measure changes in resistance value. The humidity standing test was carried out by allowing each sample to stand under conditions of a temperature of 85° C. and a humidity of 85% RH for 500 hours. The changes in the resistance value of each sample are shown in Table 2.

TABLE 2

| Plating of electrode (heating temperature) | Presence of fusion-bonding | Time of standing in humidity (85° C., 85% RH) | | | | Evaluation |
|---|---|---|---|---|---|---|
| | | 0 hour | 100 hours | 300 hours | 500 hours | |
| Sn-37Pb (150° C.) | No melting | 0.0058 Ω | 0.0548 Ω | 0.3815 Ω | 0.3559 Ω | X |
| Sn (150° C.) | No melting | 0.0074 Ω | 0.0279 Ω | 0.0931 Ω | 0.2881 Ω | |
| Sn-48In (150° C.) | Melting | 0.0048 Ω | 0.0031 Ω | 0.0034 Ω | 0.0037 Ω | O |
| Sn-58Bi (150° C.) | Melting | 0.0031 Ω | 0.0025 Ω | 0.0028 Ω | 0.0026 Ω | |
| Sn-37Pb (200° C.) | Melting | 0.0019 Ω | 0.0019 Ω | 0.0020 Ω | 0.0020 Ω | |
| Sn (250° C.) | Melting | 0.0034 Ω | 0.0040 Ω | 0.0041 Ω | 0.0044 Ω | |

Table 2 indicates that at the temperature at which the plated layer forming the electrode surface was not melted, fusion-bonding between the conductive adhesive and the electrode was not obtained, while at the temperature at which the plated layer was melted, fusion-bonding between the conductive adhesive and the electrode was obtained. Table 2 also indicates that in the samples in which fusion-bonding was not obtained, the resistance value increased in the humidity standing test even with the low initial resistance value. This is possibly due to the fact that moisture entered the interface between the conductive adhesive and the electrode. In contrast, in the sample in which fusion-bonding was obtained, the resistance value did not significantly increase even in the humidity standing test.

Example 2

The various types of plating (Sn-48In, Sn-58Bi, Sn-37Pd plating) shown in Table 2 were applied on an external electrode of a monolithic ceramic capacitor having a size of 2.0×1.25×1.25 mm to form samples. Each of the samples was bonded to a copper electrode formed on a substrate with a conductive adhesive containing the same filler as Example 1 under the heating condition shown in Table 3. A plated layer was formed on the copper electrode using the same plating method as that used on the external electrode of the monolithic capacitor.

TABLE 3

| Sample No. | Product | Surface of electrode | Heating condition in mounting (° C.) | Heating time (min) |
|---|---|---|---|---|
| 9 | Monolithic ceramic capacitor | Sn-48In plated electrode | 150 | 5 |
| 10 | | Sn-58Bi plated electrode | 150 | 5 |
| 11 | | Sn-37Pb plated electrode | 150 | 5 |
| 12 | | Sn-37Pb plated electrode | 200 | 5 |

In the samples in which bonding was performed under a heating temperature higher than the melting point of the plating (i.e., in the monolithic ceramic capacitors comprising a Sn-48In plated electrode and a Sn-58Bi plated electrode and heated at 200° C.), fusion-bonding was observed between the conductive adhesive and the external electrode of the monolithic ceramic capacitor, and between the conductive adhesive and the plated layer of the substrate electrode. However, in those samples in which bonding was performed at a temperature which is lower than the melting temperature of the plating (i.e., a Sn-37Pd plated electrode and heated at 150° C.), fusion-bonding was not observed.

When the conductive filler contained in the conductive adhesive comprises a material such as solder particles or the like, which melt at low temperature (i.e., at a temperature at or below the curing temperature of the organic binder), both the plated layer formed on the electrode and the conductive filler contained in the conductive adhesive are melted during curing of the adhesive. Therefore, fusion-bonding is easily obtained, and a large effect can be expected. Furthermore, when the conductive filler comprises solder particles, the production cost of the conductive adhesive can be decreased.

The conductive adhesive is not necessarily thermosetting, and, for example, it may be ultraviolet curable. In this case, the adhesive can be cured by ultraviolet irradiation, and then heated to fusion-bond the conductive filler contained in the adhesive and the plated layer of the electrode together.

In accordance with one aspect of the present invention, in mounting a surface mount device on an electrode on a substrate, a plated layer formed on the electrode is melted, and a conductive filler contained in a conductive adhesive enters the plated layer to increase the bonding area, thereby increasing bonding strength. By using scale-like particles for the conductive filler as in the preferred embodiment, the conductive filler easily enters the melted plated layer. Also, the bonding strength at the interfaces between the electrode surface and the conductive filler surfaces can be improved to prevent moisture from entering the adhesive/electrode surface interfaces to improve moisture resistance. Furthermore, the conductive adhesive containing a special conductive filler need not be used (although it is permissible to use such fillers), thereby obtaining good characteristics without an increase in production cost. Furthermore, by using the conductive filler comprising a low-melting-point metal material layer or a low-melting-point metal material, both the plated layer and the conductive filler are easily fusion-bonded together by melting. Therefore, by using such a bonding method, a bonded structure having high reliability can be obtained.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A bonded structure comprising:
   a first substrate;
   a first electrode formed on the first substrate;
   a first low-melting-point material formed on the first electrode; and
   an organic binder formed on the first low-melting-point material, the organic binder including a conductive filler, wherein at least a part of the conductive filler is present within the first low-melting-point material, and wherein the conductive filler and the first low-melting-point material are fusion-bonded together.

2. The bonding structure according to claim 1 further comprising:
   a second substrate;
   a second electrode formed on the second substrate;
   a second low-melting-point material formed on the second electrode and connected to the organic binder, wherein at least a part of the conductive filler is present within the second low-melting-point material, and wherein the conductive filler and the second low-melting-point material are fusion-bonded together.

3. A bonding structure comprising:
   a first substrate;
   a first electrode formed on the first substrate;
   a first low-melting-point material formed on the first electrode; and
   an organic binder formed on the first low-melting-point material, the organic binder including a conductive filler, wherein at least a part of the conductive filler is present within the first low-melting-point material, the conductive filler and the first low-melting-point material are fusion-bonded together, and the first low-melting-point material comprises a Sn—Pb alloy.

4. A bonding structure comprising:
   a first substrate;
   a first electrode formed on the first substrate;
   a first low-melting-point material formed on the first electrode;
   an organic binder formed on the first low-melting-point material, the organic binder including a conductive filler, wherein at least a part of the conductive filler is present within the first low-melting-point material;
   a second substrate;
   a second electrode formed on the second substrate; and
   a second low-melting-point material formed on the second electrode and connected to the organic binder, wherein at least a part of the conductive filler is present within the second low-melting-point material,
   wherein the first and second low-melting-point material comprise a Sn—Pb alloy, and wherein the conductive filler is fusion-bonded to the first low-melting-point material and the second low-melting-point material.

5. The bonding structure according to claim 1, wherein the conductive filler includes Ag.

6. The bonding structure according to claim 2, wherein the conductive filler comprises Ag.

7. A bonding structure comprising:
   a first substrate;
   a first electrode formed on the first substrate;
   a first low-melting-point material formed on the first electrode; and
   an organic binder formed on the first low-melting-point material, the organic binder including a conductive filler, wherein at least a part of the conductive filler is present within the first low-melting-point material, the conductive filler and the first low-melting-point material are fusion-bonded together, and the conductive filler comprises solder particles.

* * * * *